(12) United States Patent
Zurcher et al.

(10) Patent No.: US 7,259,100 B2
(45) Date of Patent: Aug. 21, 2007

(54) NANOPARTICLES AND METHOD FOR MAKING THE SAME

(75) Inventors: Fabio Zurcher, Brisbane, CA (US); Brent Ridley, San Carlos, CA (US); Klaus Kunze, Half Moon Bay, CA (US); Scott Haubrich, Castro Valley, CA (US); Joerg Rockenberger, Redwood City, CA (US)

(73) Assignee: Kovio, Inc., Sunnyvale, CA (US)

( * ) Notice: Subject to any disclaimer, the term of this patent is extended or adjusted under 35 U.S.C. 154(b) by 96 days.

(21) Appl. No.: 11/271,041

(22) Filed: Nov. 10, 2005

(65) Prior Publication Data

US 2006/0094189 A1    May 4, 2006

Related U.S. Application Data

(62) Division of application No. 10/339,741, filed on Jan. 8, 2003, now Pat. No. 7,078,276.

(51) Int. Cl.
*H01L 21/302*    (2006.01)
(52) U.S. Cl. ............. 438/700; 438/742; 438/756; 438/479; 205/674; 205/684; 977/888
(58) Field of Classification Search ........ 438/479–509, 438/689, 722, 723, 752, 753, 756, 779, 888
See application file for complete search history.

(56) References Cited

U.S. PATENT DOCUMENTS 4,130,671 A   12/1978   Nagesh et al. ............. 427/125
4,186,244 A   1/1980   Deffeyes et al. ............. 428/570
4,381,945 A   5/1983   Nair ........................ 106/1.14
4,418,099 A   11/1983   Cuevas et al. ............. 427/229

(Continued)

FOREIGN PATENT DOCUMENTS

EP    1 000 949 A1    5/2000

(Continued)

OTHER PUBLICATIONS

"Enhanced Photoluminescene from Si Nano-organosols by Functionalization with Alkenes and Their Size Evolution", Shu-Man Liu et al., 2006, American Chemical Society, p. 637-642.

(Continued)

*Primary Examiner*—Savitri Mulpuri
(74) *Attorney, Agent, or Firm*—Haverstock & Owens LLP

(57) ABSTRACT

A method for making nanoparticles, nanoparticle inks and device layers therefrom is disclosed. In accordance with the present invention, nanoparticles are isolated from a composite material that is formed by treating a metal oxide precursor to form the metal nanoparticles and a metal oxide matrix. The nanoparticles are then isolated from the composite material by etching at least a portion of the metal oxide matrix to release the metal nanoparticles. In accordance with the embodiments of the invention, the nanoparticles are treated with surfactants and wetting agents either while etching or after etching, are isolated from the etchant and dispersed in a solvent medium and/or are otherwise treated or modified for use in a nanoparticle inks. A layer of the metal nanoparticle ink can then be used to form doped, undoped, patterned and unpatterned device layers or structures in micro-devices.

23 Claims, 6 Drawing Sheets

205

Treat the Metal Nanoparticles to a Surface Modifier to form Surface Modifed Metal Nanoparticles. — 215

Dispense the Surface Modified Metal Nanoparticles in a Solvent Medium. — 217

U.S. PATENT DOCUMENTS

| | | | | |
|---|---|---|---|---|
| 4,463,030 | A | 7/1984 | Deffeyes et al. | 427/216 |
| 4,487,811 | A | 12/1984 | Eichelberger et al. | 428/546 |
| 4,548,879 | A | 10/1985 | St. John et al. | 427/96 |
| 4,599,277 | A | 7/1986 | Brownlow et al. | 428/552 |
| 4,650,108 | A | 3/1987 | Gallagher | 228/124 |
| 4,775,439 | A | 10/1988 | Seeger, Jr. et al. | 156/231 |
| 4,808,274 | A | 2/1989 | Nguyen | 204/15 |
| 4,859,241 | A | 8/1989 | Grundy | 106/1.14 |
| 4,871,790 | A | 10/1989 | Lamanna et al. | 523/333 |
| 5,059,242 | A | 10/1991 | Firmstone et al. | 106/1.23 |
| 5,071,826 | A | 12/1991 | Anderson et al. | 505/1 |
| 5,075,262 | A | 12/1991 | Nguyen et al. | 501/19 |
| 5,110,760 | A | 5/1992 | Hsu | 437/180 |
| 5,147,841 | A | 9/1992 | Wilcoxon | 502/173 |
| 5,173,330 | A | 12/1992 | Asano et al. | 427/558 |
| 5,183,784 | A | 2/1993 | Nguyen et al. | 501/19 |
| 5,250,229 | A | 10/1993 | Hara et al. | 252/518 |
| 5,262,357 | A | 11/1993 | Alivisatos et al. | 437/233 |
| 5,270,368 | A | 12/1993 | Lent et al. | 524/236 |
| 5,281,447 | A | 1/1994 | Brady et al. | 427/555 |
| 5,338,507 | A | 8/1994 | Anderson et al. | 505/470 |
| 5,378,408 | A | 1/1995 | Carroll et al. | 252/514 |
| 5,559,057 | A | 9/1996 | Goldstein | 437/228 |
| 5,569,448 | A | 10/1996 | Wong et al. | 424/9.45 |
| 5,576,248 | A | 11/1996 | Goldstein | 437/225 |
| 5,587,111 | A | 12/1996 | Watanabe et al. | 252/514 |
| 5,690,807 | A * | 11/1997 | Clark et al. | 205/655 |
| 5,718,800 | A | 2/1998 | Juengling | 156/643 |
| 5,728,856 | A | 3/1998 | Denk | 556/407 |
| 5,798,428 | A | 8/1998 | Schwab et al. | 528/14 |
| 5,882,722 | A | 3/1999 | Kydd | 427/123 |
| 5,922,403 | A | 7/1999 | Tecle | 427/212 |
| 5,958,999 | A | 9/1999 | Bates et al. | 523/161 |
| 5,966,580 | A | 10/1999 | Watanabe et al. | 419/9 |
| 6,015,596 | A | 1/2000 | Miwa et al. | 427/489 |
| 6,027,705 | A | 2/2000 | Kitsuno et al. | 423/347 |
| 6,033,783 | A | 3/2000 | Tanaka et al. | 428/408 |
| 6,086,790 | A | 7/2000 | Hayashi et al. | 252/500 |
| 6,139,626 | A | 10/2000 | Norris et al. | 117/68 |
| 6,159,839 | A | 12/2000 | Jeng et al. | 438/618 |
| 6,190,731 | B1 | 2/2001 | Tecle | 427/213.3 |
| 6,194,316 | B1 | 2/2001 | Oda et al. | 438/687 |
| 6,211,285 | B1 | 4/2001 | Grunbauer et al. | 524/591 |
| 6,254,662 | B1 | 7/2001 | Murray et al. | 75/348 |
| 6,268,041 | B1 | 7/2001 | Goldstein | 428/208 |
| 6,274,412 | B1 | 8/2001 | Kydd et al. | 438/149 |
| 6,277,448 | B2 | 8/2001 | Strutt et al. | 427/452 |
| 6,294,401 | B1 | 9/2001 | Jacobson et al. | 438/99 |
| 6,303,499 | B1 | 10/2001 | Sato | 438/676 |
| 6,306,594 | B1 | 10/2001 | Cozzette et al. | 435/6 |
| 6,313,015 | B1 * | 11/2001 | Lee et al. | 438/478 |
| 6,344,271 | B1 | 2/2002 | Yadav et al. | 428/402 |
| 6,348,295 | B1 | 2/2002 | Griffith et al. | 430/198 |
| 6,358,611 | B1 | 3/2002 | Nagasawa et al. | 428/403 |
| 6,372,077 | B1 | 4/2002 | Tecle | 156/279 |
| 6,514,801 | B1 | 2/2003 | Yudasaka et al. | 438/151 |
| 6,518,087 | B1 | 2/2003 | Furusawa et al. | 438/96 |
| 6,524,663 | B1 | 2/2003 | Kelly et al. | 427/553 |
| 6,572,673 | B2 | 6/2003 | Lee et al. | 75/362 |
| 6,576,291 | B2 | 6/2003 | Bawendi et al. | 427/215 |
| 6,585,796 | B2 | 7/2003 | Hosokura et al. | 75/373 |
| 6,586,785 | B2 | 7/2003 | Flagan et al. | 257/261 |
| 6,605,496 | B1 | 8/2003 | Yamazaki | 438/166 |
| 6,630,201 | B2 | 10/2003 | Chiang et al. | 427/255.28 |
| 6,699,723 | B1 | 3/2004 | Weiss et al. | 436/518 |
| 6,710,366 | B1 * | 3/2004 | Lee et al. | 257/14 |
| 6,743,406 | B2 * | 6/2004 | Nayfeh et al. | 423/348 |
| 6,878,184 | B1 | 4/2005 | Rockenberger et al. | 75/343 |
| 6,897,151 | B2 * | 5/2005 | Winter et al. | 438/687 |
| 6,913,865 | B2 * | 7/2005 | Fedynyshyn | 430/191 |
| 6,970,239 | B2 * | 11/2005 | Chan et al. | 356/301 |
| 7,151,209 | B2 * | 12/2006 | Empedocles et al. | 438/689 |
| 2001/0021760 | A1 | 9/2001 | Matsuki et al. | 528/10 |
| 2002/0018896 | A1 | 2/2002 | Fukunaga et al. | 428/407 |
| 2002/0070121 | A1 | 6/2002 | Nayfeh et al. | 205/549 |
| 2002/0074547 | A1 | 6/2002 | Yudasaka et al. | 257/57 |
| 2002/0104762 | A1 * | 8/2002 | Stonas et al. | 205/118 |
| 2002/0179906 | A1 | 12/2002 | Yudasaka et al. | 257/57 |
| 2003/0010971 | A1 * | 1/2003 | Zhang et al. | 257/15 |
| 2003/0087485 | A1 * | 5/2003 | Leung et al. | 438/200 |
| 2003/0180451 | A1 | 9/2003 | Kodas et al. | 427/123 |
| 2004/0157414 | A1 * | 8/2004 | Gole et al. | 438/487 |
| 2005/0029678 | A1 * | 2/2005 | Hanrath et al. | 257/784 |
| 2005/0072679 | A1 * | 4/2005 | Nayfeh et al. | 205/74 |
| 2005/0112048 | A1 * | 5/2005 | Tsakalakos et al. | 423/439 |
| 2005/0164480 | A1 | 7/2005 | Haubrich et al. | 438/597 |
| 2005/0266662 | A1 * | 12/2005 | Yi | 438/479 |
| 2006/0001726 | A1 * | 1/2006 | Kodas et al. | 347/105 |
| 2006/0009003 | A1 * | 1/2006 | Romano et al. | 438/382 |
| 2006/0019470 | A1 * | 1/2006 | Seifert et al. | 438/483 |
| 2006/0046480 | A1 * | 3/2006 | Guo | 438/685 |
| 2006/0148272 | A1 * | 7/2006 | Barron et al. | 438/780 |

FOREIGN PATENT DOCUMENTS

| | | |
|---|---|---|
| GB | 2 077 710 A1 | 12/1981 |
| JP | 07-267621 | 10/1995 |
| JP | 09-237927 | 9/1997 |
| JP | 11-014841 | 1/1999 |
| JP | 11-130867 | 5/1999 |
| JP | 2001-011184 | 1/2001 |
| JP | 2001-055444 | 2/2001 |
| JP | 2001-058996 | 3/2001 |
| JP | 2001-089572 | 4/2001 |
| JP | 2001-244465 | 9/2001 |
| JP | 2001-308020 | 11/2001 |
| JP | 2002-110573 | 4/2002 |
| JP | 2002-110663 | 4/2002 |
| WO | WO98/04761 A1 | 2/1998 |
| WO | WO 01/14250 A2 | 3/2001 |
| WO | WO 01/38222 A1 | 5/2001 |
| WO | WO 01/73150 A1 | 10/2001 |
| WO | WO 01/87775 A1 | 11/2001 |
| WO | WO 01/88540 A1 | 11/2001 |

OTHER PUBLICATIONS

F. Hamelmann et al., "In-Situ Controlled Deposition of Thin Silicon Films by Hot-Filament MOCVD with (C5Me5) Si2H5 and (C5Me4H)SiH3 as Silicon Precursors", Thin Silicon Films by Hot-Filament MOCVD pp. 799-805.

A. Klipp et al, "The Synthesis of Cyclopentadienyl Silanes and Disilanes and their Fragmentation under Thermal CVD Conditions", Cyclopentadienyl Silanes and Disilanes, pp. 807-811.

E. Hengge et al, "Darstellung ud Eigenshaften von Cyclopentasilan", Institut fur Anorganische Chemie der Technischon Hochschule, (1974), pp. 503-512.

E. Hengge et al, "Cyclopentasilane, the First Unsubstituted Cyclic Silicon Hybride", Institut fur Anorganische Chemie der Technischon Hochschule (1972).

F. Feher et al, "Weitere Untersuchungen zur Darstellung eines Silangemisches", Z. anorg. Allg. Chem 530 (1985), pp. 191-195.

Edwin Hengge et al, "Periodated Cyclosilanes", Angew Chem. Int. Ed. Engl. 20(1981) No. 8, p. 678.

Edwin Hengge and Friedrich Lunzer, "Zur Chemie der Cyclohexasilane", Monatshefte fur Chemie 107, (1976), pp. 371-385.

Dieter Kovar et al, "Si-NMR-Untersuchungen and einigen Cyclosilanderivaten", Monatshefte for Chemie 110, (1979), pp. 1295-1300.

Harald Stuger et al, "UV/Vis-spektroskopische Untersuchungen an Cyclosilanderivaten", Monatshefte for Chemie 119, (1988), pp. 873-887.

M. T. Swihart et al, "Modeling the Nucleation Kinetics and Aerosol Dynamics of Particle Formation during CVD of Silicon from Silane", J. Aerosol Sci. vol. 29, Suppl. 1, (1998), pp. S79-S80.

Xianmao Lu et al, "Growth of Single Crystal Silicon Nanowires in Supercritical Solution from Tethered Gold Particles on a Silicon Substrate", NANO Letters vol. 0, No. 0, pp. A-G.

Zhifeng Ding et al, "Electrochemistry and Electrogenerated Chemiluminescence from Silicon Nanocrystal Quantum Dots", Science vol. 296, May 17, 2002, pp. 1293-1297.

Justin D. Holmes et al, "Control of Thickness and orientation of Solution-Grown Silicon Nanowires", Science vol. 287, Feb. 25, 2000, pp. 1471-1473.

Justin D. Holmes et al, "Highly Luminescent Silicon Nanocrystals with Discrete Optical Transitions", Journal of American Chemical Society, vol. 123 (2001), pp. 3743-3748.

J. P. Wilcoxon et al, "Synthesis and Optical Properties of Colloidal Germanium Nanocrystals", Physical Review B, vol. 64 (2001), pp. 035417-1-035417-9.

J. P. Wilcoxon et al, "Optical and Electronic Properties of Si Nanoclusters Synthesized in inverse Micelles", vol. 60, No. 4, Jul. 15, 1999, pp. 2704-2714.

J. P. Wilcoxon et al, "Liquid Chromatographic Analysis and Characterization of Inorganic Nanoclusters", NanoStructured Materials, vol. 9 (1997), pp. 85-88.

Frederick C. K. Au et al, "Electron Field Emission from Silicon Nanowires", vol. 75, No. 12, Applied Physics Letters, Sep. 20, 1999, pp. 1700-1702.

J. M. Therrien et al, "Synthesis of Ultra-Small Si Nano Particle Colloids and Thin Films-High Temperature Single Electronics", Department of Physics University of Illinois at Urbana-Champaign, 6 pages.

Zain Yamani et al, "Excitation of Size Selected Nanocrystallites in Porous Silicon", Applied Physics Letters, vol. 72, No. 20, May 18, 1998, pp. 2556-2558.

W. Howard Thompson et al, "The Effect of Ultrathin Oxides on Luminescent Silicon Nanocrystallites", vol. 73, No. 6, Aug. 10, 1998, pp. 841-843.

Zain Yamani et al, "Revival of Interband Crystalline Reflectance from Nanocrystallities in Porous Silicon by Immersion Plating", Applied Physics Letters, vol. 74, No. 23, Jun. 7, 1999, pp. 3483-3485.

M. Nayfeh et al, "Highly Nonlinear Photoluminescence Threshold in Porous Silicon", Applied Physics Letters. vol. 75, No. 26, Dec. 27, 1999, pp. 4112-4114.

Joel Therrien et al, "Light-induced Conductance Resonance in Ultrasmall Si Nanoparticles", Applied Physics Letters, vol. 77, No. 11, Sep. 11, 2000, pp. 1668-1670.

O. Alcakir et al, "Detection of Luminescent Single Ultrasmall Silicon Nanoparticles using Fluctuation Correlation Spectroscopy", Applied Physics Letters, vol. 76, No. 14, Apr. 3, 2000, pp. 1857-1859.

M. H. Nayfeh et al, "Second Harmonic Generation in Microcrystallite Films of Ultrasmall Si Nanoparticles", Applied Physics Letters, vol. 77, No. 25, Dec. 18, 2000, pp. 4086-4088.

Gennadiy Belomoin et al, "Oxide and Hydrogen Capped Utrasmall Blue Luminescent Si Nanoparticles", Applied Physics Letters, vol. 77, No. 6, Aug. 7, 2000, pp. 779-781.

M. H. Nayfeh et al, "Stimulated Blue Emission in Reconstituted Films of Ultrasmall Silicon Nanoparticles", Applied Physics Letters, vol. 78, No. 8, Feb. 19, 2001, pp. 1131-1133.

L. Mitas et al, "Effect of Surface Reconstruction on the Structural Prototypes of Ultrasmall Ultrabright Si29 Nanoparticles", Applied Physics Letters, vol. 78, No. 13, Mar. 26, 2001, pp. 1918-1920.

E. Rogozhina et al, "Si-N Linkage in Ultrabright, Ultrasmall Si Nanoparticles", Applied Physics Letters, vol. 78, No. 23, Jun. 4, 2001, pp. 3711-3713.

N. Rigakis et al, "Effect of Oxidation Treatments on Photoluminescence Excitation of Porous Silicon", Journal of Applied Physics, vol. 81, Jan. 1, 1997, pp. 440-444.

Zain Yamani et al, "Red to Green Rainbow Photoluminescence from Unoxidized Silicon Nanocrystallites", Journal of Applied Physics, vol. 83, No. 7, Apr. 1, 1998, pp. 3929-3931.

Zain Yamani et al, "Ideal Anodization of Silicon", Applied Physics Letters, vol. 70. No. 25, Jun. 23, 1997, pp. 3404-3406.

"Superlattice Process Controls Size of Si Nanocrystals on Si Wafers" MRS Bulletin, Dec. 2001.

J. Heitmann et al, "Size Controlled nc-Si Synthesis by SiO/SiO2 Superlattices", Journal of Non-Crystalline Solids 299-302 (2002) . pp. 1075-1078.

M. Schmidt et al, "Er Doping of Nanocrystalline-Si/SiO2 Superlattices", Thin Solid Films 397 (2001), pp. 211-215.

U. Kahler et al, "Size Evolution and Photoluminescence of Silicon Nanocrystallites in Evaporated SiOx Thin Films upon Thermal Processing", Applied Physics A, vol. 74, (2002), pp. 13-17.

Uwe Kahler et al, "Synthesis of Si Nanoparticles within Buried Layers of SiOx", Max Planck Institut fur Mikrostrukturphysik, Halle, Germany.

U. Kahler, "Visible Light Emission from Si Nanocrystalline Composites via Reactive Evaporation of SiO", Optical Materials 17, (2001), pp. 83-86.

Mikito Mamiya et al, "Preparation of Fine Silicon Particles from Amorphous Silicon Monoxide by the Disproportionation Reaction", Journal of Crystal Growth 229, (2001), pp. 457-461.

Mikito Mamiya et al, "Crystallization of Fine Silicon Particles from Silicon Monoxide", Journal of Crystal Growth 237-239, (2002), pp. 1909-1914.

M. Zacharias et al, "Size-controlled Highly Luminescent Silicon Nanocrystals: A SiO/SiO2 Superlattice Approach", Applied Physics Letters, vol. 80, No. 4, Jan. 28, 2002, pp. 661-663.

L. A. Nesbit, "Annealing Characteristics of Si-rich SiO2 Films", Appl. Phys. Letters. vol. 46, Jan. 1, 1985, pp. 38-40.

G. W. Rubloff, "Defect Microchemistry in SiO2/Si Structures", Journal Vacuum Sci. Technology A vol. 8, May/Jun. 1990, pp. 1857-1863.

J. Heitmann et al, "Synthesis and Size-control of Si Nanocrystals by SiO/SiO2 Superlattices", Selected Results, p. 38-39.

M. Schmidt et al, "Bright Luminescence from Erbium Doped nc-Si/SiO2 Superlattices", Journal of Non-Crystalline Solids299-302, (2002), pp. 678-682.

Margit Zacharias, "Crystallization in the Limit of Ultra Thin Layers—A New Crystallization Model", Material Research Society Symp. vol. 638,, (2001), pp. F6.2.1-F6.2.6.

M. Zacharias et al, "Confinement Effects in Crystallization and Er Doping of Si Nanostructures", Physica E 11, (2001), pp. 245-251.

M. Zacharias et al, "Crystallization of Amorphous Superlattices in the Limit of Ultrathin Films with Oxide Interfaces", Physical Review B, vol. 62, No. 12, Sep. 15, 2000, pp. 8391-8396.

B. J. Hinds et al, "Investigation of Postoxiation Thermal Treatments of Si/SiO2 Interface in Relationship to the Kinetics of Amorphous Si Suboxide Decomposition", Journal Vacuum Sci. Technol. B, Jul./Aug. 1998, pp. 2171-2176.

A. Hohl et al, "An Interface Clusters Mixture Model for the Structure of Amorphous Silicon Monoxide (SiO)", White Paper, Darmstadt University of Technology, Institute for Materials Science, Darmstadt, Germany.

Satoru Watanabe, "Step Structure of Silicon Surface Hydrogenated in Solution as Revealed with Angle-resolved Polarized Infrared Spectroscopy", Surface Science 415, (1998), pp. 385-391.

M. K. Weldon et al, "Si-H Bending Modes as a Probe of Local Chemical Structure: Thermal and Chemical Routes to Decomposition of H2O on Si(100)-(2X1)", Journal of Chemical Physics, vol. 113, No. 6, Aug. 8, 2000, pp. 2440-2446.

K. T. Queeney et al, "In-Situ FTIR Studies of Reactions at the Silicon/Liquid Interface: Wet Chemical Etching of Ultrathin SiO2 on Si(100)", Journal Phys. Chem. B. vol. 105, (2001), pp. 3903-3907.

X. Zhang et al, "Oxidation of H-covered Flat and Vicinal Si(111)-1X1 Surfaces", Journal Vac. Sci. Technol. A 19, Jul./Aug. 2001, pp. 1725-1729.

M. K. Weldon et al, "Mechanistic Studies of Silicon Oxidation", Journal Vac. Sci. Technol. A 19, Jul./Aug. 1999, pp. 1795-1802.

Y. J. Chabal, "Hydride Formation on the Si(100):H20 Surface", Physical Review B, vol. 29, No. 6, Mar. 15, 1984, pp. 3677-3680.

R. Honke et al, "Anharmonic Adlayer Vibrations on the Si(111):H Surface", Physical Review B, vol. 59, No. 16, Apr. 15, 1999, pp. 10 996-11 013.

Y. J. Chabal et al, "Silanone (Si═O) on Si(100): Intermediate for Initial Silicon Oxidation", Physical Review Letters B vol. 66, (2002), pp. 161315-1-161315-4.

Y. J. Chabal et al, "New Ordered Structure for the H-Saturated Si(100) Surface: The (3X1) Phase", Physical Review Letters, vol. 54, No. 10, Mar. 11, 1985, pp. 1055-1058.

Marcus K. Weldon et al, "Initial H20-induced Oxidation of Si(100)-(2X1)", Physical Review Letters, vol. 79, No. 15, Oct. 13, 1997, pp. 2851-2854.

S. Schuppler et al, "Size, Shape, and Composition of Luminescent Species in Oxidized Si Nanocrystals and H-passivated Porous Si" Physical Review B, vol. 52, No. 7, Aug. 15, 1995, pp. 4910-4925.

D. V. Tsu et al, "Effects of the Nearest Neighbors and the Alloy Matrix on SiH Stretching Vibrations in the Amorphous $SiO_r$:H ($0<r<2$) Alloy System", Physical Review B, vol. 40, No. 3, Jul. 15, 1989, pp. 1795-1805.

Michio Niwano, "In-situ IR Observation of Etching and Oxidation Processes of Si Surfaces", Surface Science 427-428, (1999), pp. 199-207.

K. T. Queeney et al, "Infrared Spectroscopic Analysis of the $Si/SiO2$ Interface Structure of Thermally Oxidized Silicon", Journal of Applied Physics, 2000, vol. 87, No. 3, Feb. 1, 2000, pp. 1322-1330.

Y. Caudano et al, "Investigation of the Bending Vibrations of Vicinal H/Si(111) Surfaces by Infrared Spectroscopy", Surface Science 502-503, (2002), pp. 91-95.

Jaroslav Flidr et al, Extracting Site-specific Reaction Rates from steady state Surface Morphologies: Kinetic Monte Carlo Simulations of Aqueous Si(111) Etching, Journal of Chemical Physics, vol. 108, No. 13, Apr. 1, 1998, pp. 5542-5553.

X. Zhang et al, "Stability of HF-etched Si(100) Surfaces in Oxygen Ambient", Applied Physics Letters, vol. 79, No. 24, Dec. 10, 2001, pp. 4051-4053.

Marcus K. Weldon et al, "The Surface Science of Semiconductor Processing: Gate Oxides in the Ever-shrinking Transistor", Surface Science 500, 2002, pp. 859-878.

Satoru Watanabe, "Step Structure on H/Si Formed in Hot Water as Revealed with Angle-resolved Polarized Infrared Spectroscopy", Applied Surface Science 130-132, (1998), pp. 231-236.

Satoru Watanabe et al, "Anisotropic Dynamic Polarization of Surface Vibrations Associated with H on Stepped Si(111)", Chemical Physica Letters 244, Sep. 29, 1995, pp. 105-110.

Satoru Watanabe, "Chemical Structure and Surface Phonons Associated with H on Si", Journal of Chemical Physics, vol. 108, No. 14, Apr. 8, 1998, pp. 5965-5974.

Satoru Watanabe et al, "Anisotropy of Vibrational Polarizations Associated with H on Si", Surface Science 357-358, (1996), pp. 536-539.

A. B. Gurevich et al, "Thermal Evolution of Impurities in Wet Chemical Silicon Oxides", Applied Physics Letters, vol. 74, No. 9, Mar. 1, 1999, pp. 1257-1259.

James T. C. Wojtyk et al, "Modification of Porous Silicon Surfaces with Activated Ester Monolayers", Langmuir, vol. 18, (2002), pp. 6081-6087.

Alexander B. Sieval et al, "High-Quality Alkyl Monolayers on Silicon Surfaces", Advanced Materials, vol. 12, No. 19, Oct. 2, 2000, pp. 1457-1460.

A. B. Sieval et al, "Highly Stable Si-C Linked Functionalized Monolayers on the Silicon (100) Surface", Langmuir, vol. 14, (1998), pp. 1759-1768.

Alexander B. Sieval et al, "An Improved Method for the Preparation of Organic Monolayers of 1-Alkenes on Hydrogen-Terminated Silicon Surfaces", Langmuir vol. 15, (1999), pp. 8288-8291.

Alexander B. Sieval et al, "Amino-Terminated Organic Monolayers on Hydrogen-Terminated Silicon Surfaces", Langmuir vol. 17, (2001) pp. 7554-7559.

R. Boukherroub et al, "Ideal Passivation of Luminescent Porous Silicon by Thermal, Noncatalytic Reaction with Alkenes and Aldehydes", Chem. Mater., vol. 13, (2001), pp. 2002-2011.

Rabah Boukherroub et al, "Controlled Functionalization and Multistep Chemical Manipulation of Covalently Modified Si(111) Surfaces", Journal of American Chemical Society, vol. 121, (1999), pp. 11513-11515.

James T. C. Wojtyk et al, "Reagentless Micropatterning of Organics on Silicon Surfaces: Control of Hydrophobic/Hydrophilic Domains", Journal of American Chemical Society, vol. 123, (2001), pp. 1535-1536.

R. Boukherroub et al, "New Synthetic Routes to Alkyl Monolayers on the Si(111) Surface", Langmuir, vol. 15, (1999), pp. 3831-3835.

Rabah Boukherroub et al, "Insights into the Formation Mechanisms of Si-OR Monolayers from the Thermal Reactions of Alcohols and Aldehydes with Si(111)-H1", Langmuir, vol. 16,(2000), pp. 7429-7434.

Jillian M. Buriak, "Organometallic Chemistry on Silicon and Germanium Surfaces", Chemical Reviews, vol. 102, No. 5, May 2002, pp. 1272-1308.

Richard K. Baldwin et al, "Solution Reduction Synthesis of Surface Stabilized Silicon Nanoparticles", Chem.Commun, (2002), pp. 1822-1823.

Richard K. Baldwin et al, "Room Temperature Solution Synthesis of Alkyl-Capped Tetrahedral Shaped Silicon Nanocrystals", J. Am. Chem. Soc., vol. 124 No. 7, (2002), pp. 1150-1151.

Chung-Sung Yang et al, "Photoluminescence as a Function of Aggregated Size from n-Butyl-Terminated Silicon Nanoclusters", Journal of Cluster Science, vol. 11, No. 3,(2000), pp. 423-431.

Chung-Sung Yang et al, "Synthesis of Alkyl-Terminated Silicon Nanoclusters by a Solution Route", J. Am. Chem. Soc., vol. 121, (1999), pp. 5191-5195.

Frank Uhlig, "Zur Darstellung Von Permethylierten Cyclosilanylalkalimetall-Derivaten", Journal of Organometallic Chemistry 493, (1995), pp. 33-40.

G. P. Lopinski et al, "How Stereoselective Are Alkene Addition Reactions on Si(100)?", Journal of American Chemical Society 2000, 122, pp. 3548-3549.

Akira Watanabe et al, "Micropatterning of $SiO2$ Film Using Organosilicon Nanocluster as a Precursor", Thin Solids Films vol. 354, (1999), pp. 13-18.

Akira Watanabe et al, "Formation of Polysilane Film by Laser CVD", Thin Solid Films 312, (1998), pp. 123-129.

Akira Watanabe et al, "Control of Silicon Dimensionality of Polysilanes and Their Optical Properties", Institute of Chemical Reaction Science Tohoku University & Hitachi Research Laboratory, pp. 1-3.

Akira Watanabe et al, "Silicon-germanium Alloys Prepared by the Heat Treatment of Silicon Substrate Spin-coated with Organo-soluble Germanium Cluster", Materials Letters 47, (2001), pp. 89-94.

Akira Watanabe et al, "Effect of Hydrogen Plasma Treatment on Formation of Amorphous Silicon Film Using Organosoluble Silicon Cluster as a Precursor", Japanese Journal of Applied Physics vol. 39, (2000), pp. L961-L963.

Akira Watanabe et al, Preparation of Germanium Thin Film by a Coating Technique Using a Soluble Organogermanium Cluster as a Precursor, Journal of Materials Science Letters 20, (2001), pp. 491-493.

Akira Watanabe et al, "Soluble Three-Dimensional Polysilane with Organosilicon Nanocluster Structure", Japanese Journal of Applied Physics, vol. 36, (1997), pp. L1265-L1267.

Akira Watanabe et al, "Origin of Boad Visible Emission from Branched Polysilane and Polygermane Chains", Japanese Journal of Applied Physics, vol. 40,(2001),pp. 6457-6463.

Aaron Puzder et al, "Surface Chemistry of Silicon Nanocluster", Physical Review Letters, vol. 88, No. 9, Mar. 4, 2002, pp. 097401-1-097401-4.

Y. H. Tang et al, "Si Nanowires Synthesized from Silicon Monoxide by Laser Ablation", Journal Vacuum Science Technology B 19(1), Jan./Feb. 2001, pp. 317-319.

S. Aihara et al, "Electroreductive Synthesis and Optical Characterization of Silicon Nanoparticles", Journal of Non-Crystalline Solids 296, (2001), pp. 135-138.

N. Binggeli et al, "Photoemission Spectra and Structures of Si Clusters at Finite Temperature", Physical Review Letters, vol. 75, No. 3, Jul. 17, 1995, pp. 493-496.

Robert A.Senter et al,"Synthesis of Silicon Nanocrystals with Erbium-Rich Surface Layers", Nano Letters, vol. 1, No. 7,(2001), pp. 383-386.

M.L. Ostraat et al, "Synthesis and Characterization of Aerosol Silicon Nanocrystal Nonvolatile Floating-gate Memory Devices", Applied Physics Letters, vol. 79, No. 3, Jul. 16, 2001, pp. 433-435.

Wen-Sheng Shi et al, "Synthesis of Large Areas of Highly Oriented, Very Long Silicon Nanowires", Advanced Materials, vol. 12, No. 18, Sep. 15, 2000, pp. 1343-1345.

M. K. Sunkara et al, "Bulk Synthesis of Silicon Nanowires Using a Low-temperature Vapor-liquid-solid Method", Applied Physics Letters, vol. 79, No. 10, Sep. 3, 2001, pp. 1546-1548.

Libing Zhang et al, "Luminescent Si Nanoparticles in Sol-Gel Matrices Stabilized by Amino Acids", Chem. Mater., (1997), vol. 9, pp. 2249-2251.

L. Pavesl et al, "Optical Gain in Silicon Nanocrystals", Nature, vol. 408, Nov. 2000, pp. 440-444.

Christopher C. Striemer et al, "Controlled Nucleation of Silicon Nanocrystals on a Periodic Template", Nano Letters, vol. 1, No. 11, (2001), pp. 643-646.

Takafumi Seto et al, "Laser Synthesis of Uniform Silicon Single Nanodots", Nano Letters, vol. 1, No. 6, (2001), pp. 315-318.

Yiying Wu et al, "Melting and Welding Semiconductor Nanowires in Nanotubes", Advanced Materials, vol. 13, No. 7, (2001), pp. 520-523.

Takehito Yoshida et al, "Near-IR LEDs Fabricated with Monodispersed Nanocrystallite Si", Solid State Technology, Apr. 2002.

Kristen C. Scheer et al, "Oxidation of Silicon Nanocrystals", Mat. Res. Soc. Symp. Proc., vol. 638, (2001), pp. F6.3.1-F6.3.6.

Altaf H. Carim et al, "Bicrystalline Silicon Nanowires", Advanced Materials, vol. 13, No. 19, (2001), pp. 1489-1491.

Michael Haaf et al, "Stable Silylenes", Accounts of Chemical Research, vol. 33, No. 10, (2000), pp. 704-714.

U. Englich et al, "Cyclohexasilanes with Exocyclic Organogermanium, -tin or -lead Groups", Journal of Organometallic Chemistry 605, (2000), pp. 22-27.

G. F. Grom et al, "Raman Spectroscopy of Si Nanocrystalline Si Superlattices: Size, Shape and Crystallographic Orientation", Mat. Res. Soc. Symp. Proc., vol. 638, (2001), pp. F6.1.1-F6.1.6.

D. Das et al, "Enhancement of Oxidation Rate of a Si Nanoparticles During Dehydrogenation", Applied Physics Letters, vol. 79, No. 22, Nov. 26, 2001, pp. 3705-3707.

Feng Tao et al, "Binding and Structure of Acetonitrile on Si(111)-7 X7", Journal of Physical Chemistry B, vol. 106, (2002), pp. 3890-3895.

E. Hengge & D. Kovar, "Darstellung und Charakterisierung von Cyclohexasilan Si6H12", Z.Anorg. allg.Chem 459, pp. 123-130, 1979.

E. Hengge & D. Kovar, "Darstellung und Charakterisierung heines neuen Cyclischen Siliciumchlorides Si4C18", Z.Anorg.allg. Chem 458, pp. 163-167, 1979.

G. Belomoin et al, "Observation of a magic discrete family of ultrabright Si nanoparticles", Applied Physics Letters vol. 80, No. 5, Feb. 4, 2002, pp. 841-843.

Chung-Wei Lin et al, "Structure and optical properties of silicon-germanium alloy nanoparticles", Journal of Applied Physics vol. 91, No. 4, Feb. 15, 2002, pp. 2322-2325.

Wensheng Shi et al, "Free-standing Single Crystal Silicon Nanoribbons", J. Am. Chem. Soc. vol. 123, (2001), pp. 11095-11096.

A. P. Alivisatos, "Electrical Studies of Semiconductor-Nanocrystal Colloids,"MRS BULLETIN/Feb. 1998, pp. 18-23.

D. Johnson et al., "Finite Size Effects in Nanoscale Tb Particles,"J. Appl. Phys. vol. 79, No. 8, Apr. 15, 1996, pp. 5299-5301.

Diandra L. Leslie-Pelecky et al., "Self-Stabilized Magnetic Colloids: Ultrafine Co Particles in Polymers,"J. Appl. Phys., vol. 79, No. 8, Apr. 15, 1996, pp. 5312-5314.

C. B. Murray et al., "Self-Organization of CdSe Nanocrystallites into Three-Dimensional Quantum Dot Superlattices," Science, vol. 270, Nov. 24, 1995, pp. 1335-1338.

Chinmay Damle et al., "Synthesis of Ag/Pd Nanoparticles and Their Low-Temperature Alloying within Thermally Evaporated Fatty Acid Films," J. Phys. Chem. B 2002, 106, pp. 297-302.

Vijaya Patil et al., "Evidence for Novel Interdigitated Bilayer Fo4rmation of Fatty Acids during Three-Dimensional Self-Assembly on Silver Colloidal Particles," J. Am. Chem. Soc. 1997, 119, pp. 9281-9282.

Wei Wang et al., "Silver Nanoparticles Capped by Long-Chain Unsaturated Carboxylates," J. Phys. Chem. B 1999, 103, 7238-7246.

Y. H. Tang et al., "Si-Nanowires Synthesized from Silicon Monoxide by Laser Ablation", J. Vac. Sci. Technol. B 19(1), Jan./Feb. 2001, pp. 317-319.

Wen-Sheng et al., "Synthesis of Large Areas of Highly Oriented Very Long Silicon Nanowires", Advanced Materials, Sep. 15, 2000, 12, No. 18, pp. 1343-1345.

"Fluorous Phase Organic Synthesis", http://www.sigmaaldrich.com/Brands/Fluka_Riedel_Home/Organic_Synthetic/Fluorous . . . , Dec. 4, 2002.

"Kovio's Approach to Silicon", Kovio, Nov. 8, 2002, pp. 1-4.

"Theory of Alkyl-Terminated Silicon Quantum Dots", Fernando A. Reboredo et al., Journal of Physical Chemistry B 109, (2005), pp. 1072-1078.

"Synthesis of Blue Luminescent Si Nanoparticles Using Atmospheric-Pressure Microdischarges", R. Mohan Sankaran et al., Nano Letters, (2005) pp. 537-541.

"Effects of Surface Passivation on Silicon Nanoparticle Photoluminescence", David E. Harwell et al., Chemistry Letters, (2003), pp. 1194-1195.

"Photoluminescence from Silicon Nanoparticles Prepared from Bulk Amorphous Silicon Monoxide by the Disproportionation Reaction", V. Kapaklis et al., Applied Physics Letters, (2005).

"Solution Synthesis of Ultrastable Luminescent Siloxane-Coated Silicon Nanoparticles", Jing Zou et al., Nano Letters, (2004) pp. 1181-1186.

"Synthesis of Luminescent Silicon Nanopowders Redispersible to Various Solvents", Shu-man Liu et al., Langmuir, (2005), pp. 6324-6329.

"Synthesis of Amorphous Silicon Colloids by Trisilane Thermolysis in High Temperature Supercritical Solvents", Lindsay E. Pell et al., Langmuir, (2004), pp. 1181-1186.

"High-Yield Plasma Synthesis of Luminescent Silicon Nanocrystals", L. Mangolini et al., Nano Letters, (2005), pp. 655-659.

"Luminescent Silicon Nanoparticles Capped by Conductive Polyaniline Through the Self-Assembly Method", Z. F. Li et al., Langmuir, (2004),pp. 1963-1971.

"Surface Functionalization of Silicon Nanoparticles Produced by Laser-Driven Pyrolysis of Silane Followed by HF-HNO3 Etching", Xuegeng Li et al., Langmuir, (2004), pp. 4720-4727.

"Optical Gain in Monodispersed Silicon Nanocrystals", M. Cazzanelli et al., Journal of Applied Physics vol. 96, (2004), pp. 3164-3171.

"Detailed Kinetic Modeling of Silicon Nanoparticle Formation Chemistry Via Automated Mechanism Generation", Hsi-Wu et al., Journal of Physical Chemistry A, (2004), pp. 10122-10132.

"Plasma synthesis of Single-Crystal Silicon Nanoparticles for Novel Electronic Device Applications", Ameya Bapat et al., Plasma Physics and Controlled Fusion, (2004), pp. B97-B109.

"Synthesis Routs for Large Volumes of Nanoparticles", Ombretta Masala et al., Annual Review of Materials Research, (2004), pp. 41-81.

"Formation of Si-Nanoparticles in a Microwave Reactor: Comparison Between Experiments and Modelling", B. Giesen et al., Journal of Nanoparticles Research, (2005), pp. 29-41.

"The Feasibility of Inert Colloidal Processing of Silicon Nanoparticles", Michele L. Ostraat et al., Journal of Colloid and Interface Science, (2005), pp. 414-421.

"Self-Assembled Silicon Nanotubes Grown from Silicon Monoxide", Yang-Wen Chen et al., Advanced Materials, (2005), pp. 564-567.

"Amorphous and Nanocrystalline Luminescent Si and Ge Obtained Via a Solid-State Chemical Metathesis Synthesis Route", Paul F. McMillan et al., Journal of Solid-State Chemical Metathesis Synthesis Route, (2005), 937-949.

"Silicon Nanocrystals: Size Matters", Johannes Heitmann et al., Advanced Materials, (2005), pp. 795-803.

"On the Morphological Instability of Silicon / Silicon Dioxide Nanowires", F. M. Kolb et al., Applied Physics A Materials Science & Processing, (2005, pp. 1405-1408.

"Use of NMR Spectroscopy in the Synthesis and Characterization of Air-and Water-Stable Silicon Nanoparticles from Porous Silicon", R.S. Carter et al., Chemistry of Materials, (2005), pp. 2932-2939.

"Efficient Surface Grafting of Luminescent Silicon Quantum Dots by Photoinitiated Hydrosilylation", Fengiun Hua et al., Langmuir, (2005), pp. 6054-6062.

"Reductive Thermolysis of a Heterocyclic Precursor: A Convenient Method for Preparing Luminescent, Surfactant-Stabilized Silicon Nanoparticles", Bryan D. Rowsell et al., Nanotechnology, (2005), pp. 732-736.

"Structural and Optical Properties of Surface-Hydrogenated Silicon Nanocrystallites Prepared by Reactive Pulsed Laser Ablation", Toshiharu Makino et al., Journal of Physics D-Applied Physics, (2005), pp. 3507-3511.

"Surface Morphology Dependent Photoluminescence from Colloidal Silicon Nanocrystals"Jaime H. Warner et al., Journal of Physical Chemistry B, (2005), pp. 19064-19067.

"Quasi-Reversible Photoluminescence quenching of Stable Dispersions of Silicon Nanoparticles", William D. Kirkey et al., Journal of Materials Chemistry, (2005), pp. 2028-2034.

"Micro-Emulsion Synthesis of Monodisperse Surface Stabilized Silicon Nanocrystals", Richard D. Tilley et al., Chemical Communications, (2005), pp. 1833-1835.

"Three-Dimensional arrays of Si Clusters Grown at Water Surfaces and Si (100) Surfaces", S. Sato et al., Microelectronic Engineering 66 (1-4), (2003), pp. 159-165.

"Vapor-Phase Synthesis of Nanoparticles", Mark T. Swihart, Current Opinion in Colloid & Interface Science 8, (2003) pp. 127-133.

"Self-Assembly of Si Clusters Into Single Crystal Arrangements: Formation of Si-10 Cluster Crystals", Seiichi Sato et al., Japanese Journal of Applied Physics, (2003), pp. L616-L618.

"Process for Preparing Macroscopic Quantities of Brightly Photoluminescent Silicon Nanoparticles with Emission Spanning the Visible Spectrum", Langmuir, (2003) pp. 8490-8496.

* cited by examiner

203 ↘

```
┌─────────────────────────────────────┐
│ Treat the Composite Material Comprising │
│ the Metal Nanoparticles and the Metal │──211
│ Oxide Matrix to an Etchant Medium    │
│ to Release the Metal Nanoparticles.  │
└─────────────────────────────────────┘
                 ↓
┌─────────────────────────────────────┐
│ Extract the Metal Nanoparticles      │──213
│ from the Etchant Medium.             │
└─────────────────────────────────────┘
```

```
┌─────────────────────────────────────┐
│ Treat the Metal Nanoparticles to a   │
│ Surface Modifier to form Surface Modifed │──215
│ Metal Nanoparticles.                 │
└─────────────────────────────────────┘
                 ↓
┌─────────────────────────────────────┐
│ Dispense the Surface Modified Metal  │──217
│ Nanoparticles in a Solvent Medium.   │
└─────────────────────────────────────┘
```

*Fig. 2C*

NANOPARTICLES AND METHOD FOR MAKING THE SAME

RELATED APPLICATION(S)

This Application is a Divisional Application of the Application Ser. No. 10/339,741, titled "NANOPARTICLES AND METHOD FOR MAKING THE SAME", filed Jan. 8, 2003 now U.S. Pat. No. 7,078,276. The co-pending Application Ser. No. 10/339,341, titled "NANOPARTICLES AND METHOD FOR MAKING THE SAME", filed Jan. 8, 2003 is hereby incorporated by reference.

FIELD OF THE INVENTION

The present invention relates to micro-devices. More specifically, the present invention relates to methods of fabricating micro-devices using nanoparticles.

BACKGROUND OF THE INVENTION

Ultra-fine particles or nanoparticles particles having an average diameter of 200 nanometers or less) are believed to be useful in the fabrication of micro-electronic devices. Alivisatos et al., in U.S. Pat. No. 5,262,357, describe a method for making semi-conductor nanoparticles from semi-conductor precursors. Alivisatos et al. describe using these semi-conductor nanoparticles to make continuous semi-conductor films. Because the semiconductor nanoparticles exhibit significantly lower melting temperature than bulk materials, a layer of the semi-conductor nanoparticles can be deposited on a substrate and annealed at relatively low temperatures, whereby the nanoparticles melt to form a continuous film.

One of the goals for nano-technology is to develop techniques and materials that will allow for the fabrication of micro devices on a variety of substrates using selective deposition, printing and/or imaging technologies. These selective deposition, printing and/or imaging technologies can utilize nanoparticles, or inks comprising nanoparticles, to fabricate device layers and structures in micro-devices.

There have been recent efforts to make metal-based solutions which can be used to make conductive device layers in the fabrication of micro-electronic devices. For example, Kydd in U.S. Pat. No. 5,882,722 describes a method of forming conductive layers from a suspension of mixtures of a metal powder and an organo-metallic compound dispensed in an organic solvent. The suspension is deposited onto a substrate to form a layer. The layer of the suspension is then cured to remove solvents and surfactants and decomposed the mixture of the metal powder and the organo-metallic compound to form the conductive layer.

Nanoparticle technologies provide alternative methods to laborious and expensive lithographic techniques for the fabrication of micro-devices and/or methods. Therefore, there is a continued need to develop new methods for making nanoparticles and new methods for using the nanoparticles in the fabrication of micro-devices that can reduce the number of mask and etch steps required during the fabrication of the micro-devices.

SUMMARY OF THE INVENTION

The present invention is directed to methods for making nanoparticles and uses thereof. The nanoparticles of the present invention preferably have average diameter of 200 nanometers or less and preferably 100 nanometers or less. In accordance with the embodiments of the invention, the nanoparticles are metal nanoparticles that are isolated from a composite material comprising the metal nanoparticles. It is understood that metal nanoparticles herein refers to nanoparticles comprising transition metal elements and/or semiconductor elements, such as silicon and germanium.

The composite material is preferably formed by treating a metal oxide precursor to conditions, such as elevated temperatures, which causes the metal oxide precursor to disproportionate and form the metal nanoparticles and an oxide matrix, wherein the oxide matrix comprises higher metal oxides. Metal oxide precursors, suitable for making metal nanoparticles include, but are not limited to, oxides of cobalt, vanadium, manganese, niobium, iron, nickel, copper, silicon, titanium, germanium, zirconium, tin and combinations thereof. In accordance with a preferred embodiment of the invention, one or more of the metal oxide precursors that are used to form the metal nanoparticles are metal monoxide precursors, such as a silicon monoxide precursor.

After the composite material is formed, the metal nanoparticles are isolated from the composite material. The metal nanoparticles are preferably isolated from the composite material using an etchant medium to release the metal nanoparticles from the oxide matrix. In accordance with the embodiments of the invention, the etchant medium comprises a hydrogen fluoride source, which is an inorganic hydrogen fluoride source (such as $NH_4F$, HF, $KHF_2$ and KF or a combination thereof). In further embodiments of the invention, the hydrogen fluoride source is an organo-ammonium fluoride (such as pyridine:HF or any other secondary or tertiary amine:HF material). The etchant medium, in accordance with still further embodiments of the invention, comprises a surfactant, such as an amine, an amine oxide, a quaternary ammonium salt, a betaine, a sulfobentaine, a ether, a polyglycol, a polyether, a polymer, an organic ester, an alcohol, a phosphine, a phosphate, a carboxylic acid, a carboxylate, a thiol, a sulfonic acid, a sulfonate, a sulfate, a ketone, a silicone, or a combination thereof. More specific example of surfactants include, but are not limited to, methyl laureate, methyl oleate, dimethyl succinate, propyleneglycol, diglyme, hexadecylamine, ethyl dimethyl amine oxide, tetraoctyl ammonium bromide, poly n-vinyl pyrrolidone, octanol, tributyl phosphine, tributyl phosphate, trioctyl phosphine oxide, hexadecyl thiol, dodecyclbenzene sulfonate, diisobutyl ketone and dodecylohexacyclomethicone. In yet further embodiments of the invention, an etchant medium comprises a wetting agent such as a fluorinated surfactant and/or a fluorinated hydrocarbon, either alone or in combination with one or more of the aforementioned surfactants. Specific examples of wetting agents include, but are not limited to, perfluorohexanoic acid, perflourodecane, perfluoromethylvinyl ethers and hexafluoropropylene oxides.

Nanoparticles, in accordance with the embodiments of the invention, are hydrogen capped nanoparticles or nanoparticles capped with a surfactant, such as those described above. Alternatively, surfactant capped nanoparticles can be converted to hydrogen capped nanoparticles by treating the nanoparticles to lithium aluminum hydride, boro-hydride, or any other suitable hydride source.

Nanoparticles, in accordance with present invention, are doped or undoped. To form doped metal nanoparticles, a metal oxide precursor is treated which causes the metal oxide precursor to disproportionate in the presence of a dopant source, such that a dopant element from the dopant source is incorporated into the metal nanoparticles formed. The dopant source is preferably a molecular dopant source, which includes one or more atoms of the doping element such as boron, phosphorus and arsenic. Alternatively, or in addition to, doping metal nanoparticles during disproportionation of a metal oxide, metal nanoparticles can be doped after disproportionation of a metal oxide using techniques such as ion implantation.

In accordance with further embodiments of the invention, when the etchant medium is aqueous, isolating metal nanoparticles from the composite material can further comprises interfacing the aqueous etchant medium with an organic extraction medium, in order to extract the metal nanoparticles from the aqueous etchant medium after or while the metal nanoparticles are being released from the oxide matrix. In accordance with still further embodiments of the invention, the etchant medium comprises a bistable phase medium, such as a fluorous-phase medium, wherein the etchant medium is a single phase at a first temperature and during the etching process. After the etching process, the bistable phase medium is converted to separate phases at a second temperature (that is generally lower than the first temperature), wherein the nanoparticles have a preferred affinity, or solubility, in one or more of the separated phases. Once nanoparticles of the present invention are isolated, washed, and/or treated, the nanoparticles are preferably used in the formulation of a nanoparticle ink that can then be used in the fabrication of micro-devices (i.e., micro-electronic, micro-mechanical and micro-optical devices,) and/or for micro-device systems and applications including, but not limited to, biological imaging systems and applications.

A nanoparticle ink, in accordance with the embodiments of the present invention, is formed by dispersing nanoparticles into a solvent medium which preferably comprises one or more organic solvents, but can also be an aqueous solvent medium especially where the nanoparticle ink is used for biological applications. The ink formulation used, in accordance with further embodiments of the invention, comprises one or more surfactants and/or wetting agents, such as those previously mentioned. In still further embodiments of the invention, the nanoparticle ink comprises a molecular precursor that is preferably a silicon-based molecular precursor (such as a polysilane, a silylene or an organo-silane), a germanium-based molecular precursor (such as a polygermane, a germylene or an organo-germane) or a combination thereof. The molecular precursor, in accordance with still further embodiments of the invention, comprises one or more dopant elements, such as arsenic, phosphorus and/or boron, which can incorporate into a device layer.

In accordance with the embodiments of the present invention, a device layer (i.e. a conductive layer, a dielectric layer or a semiconducting layer), is formed by depositing a nanoparticle ink comprising metal nanoparticles that are dispersed in a solvent medium onto a suitable substrate structure. The suitable substrate structure comprises any number of materials including, but not limited to silicon, metal, quartz, glass and polymer materials, (i.e., polyimide). The substrate structure can also include any number of previously fabricated device layers, such as conductive layers, dielectric layers, semiconducting layers or combinations thereof.

The nanoparticle ink is deposited onto the substrate structure using any suitable deposition technique, including but not limited to, ink-jet printing, screen printing, slide-bar coating, spin coating, extrusion coating, meniscus coating, dip coating and spray coating. The layer of ink is deposited as a patterned, or an unpatterned layer. After depositing the layer of nanoparticle ink, the layer is preferably cured such that at least a portion of solvent medium, surfactants and/or wetting agents are removed from the layer and the nanoparticles fuse together. It is believed that incorporation of the molecular precursor (such as a silicone-based molecular precursor) into the nanoparticle ink formulation, can aid the ability of the nanoparticles to fuse together and/or facilitate doping of the device layer during a curing process. When a layer of nanoparticle ink is deposited as a continuous layer, the continuous layer of nanoparticle ink, in accordance with the embodiments of the present invention, can be patterned before curing using liquid embossing techniques. A patterned layer can also be formed by selective deposition techniques, such as ink jet printing, wherein the nanoparticle ink is deposited in a pattern and is then cured. Further, a patterned layer can be formed by selective curing techniques, wherein a layer of nanoparticle ink is selectively cured in a pattern using a laser to write the pattern and/or the layer of nanoparticle ink is cured through a mask, wherein uncured regions of the layer nanoparticle ink can then be removed.

Alternatively, or in addition to patterning the layer using liquid embossing techniques, a cured layer of ink can be patterned using lithographic techniques (mask/etch processes and nano-imprint lithography), laser ablation and/or any other suitable technique for patterning a solid phase layer, including Nanoparticle inks comprising a dopant precursor preferably result in device layers that are doped, as described previously. Alternatively, or in addition to forming doped layers via inclusion of a molecular dopant precursor, doped nanoparticles, or a combination thereof in a nanoparticle ink formulation, doped device layers can be formed using implanting techniques, after a patterned or an unpatterned layer of nanoparticle ink is deposited and cured.

In still further embodiments of the invention a nanoparticle ink, such as those described above, is used to form a seed layer on a suitable substrate structure. Accordingly, forming a device layer further comprises depositing an ink layer comprising a silicon-based or germanium-based molecular precursor and curing the layer or depositing a silicon-based or germanium-based molecular precursor over the seed layer using vapor deposition techniques.

In accordance with the embodiments of the invention, an ink comprises a bulk nanoparticle source, such as described above and a crystallization promoter. Suitable crystallization promoters include, but not limited to, organometallic compounds and/or metal nanoparticles of Ni, Au, Al and Fe. For example, semiconductor nanoparticles (as a bulk nanoparticle source) and an amount of an organometallic and/or metal nanoparticles of Ni, Au, Al and Fe (as a crystallization promoter) are dispersed or dissolved in a suitable solvent medium along with any number of surfactants and/or wetting agents. The ink is then deposited onto a suitable substrate and cured to form a semiconductor-based pattern or unpatterned device layer.

In yet further embodiments of the invention, a metal layer is used as a crystallization promoter, either alone or along with an ink comprising one or more organometallic and/or nanoparticle crystallization promoters, such as described above. In accordance with the embodiments of the invention, a substrate structure comprises a patterned or unpatterned metal layer that is deposited using vapor deposition of a molecular precursor, electroless plating, sputtering or any other suitable deposition method. A patterned or unpatterned layer of ink is deposited over meal layer and is cured to form a pattern or unpatterned device layer. The aforementioned molecular and nanoparticle crystallization promoters used in ink formulations and metal layer crystallization promoters are believed to help crystalize nanoparticles and form a device layer during a curing and/or annealing process. Metal layers suitable for promoting crystallization preferably include one or more metal of Ni, Au, Al and Fe.

BRIEF DESCRIPTION OF THE DRAWINGS

FIGS. 2A-D are flow-charts outlining the steps for making metal nanoparticles, isolating the metal nanoparticles, formulating nanoparticle inks, and fabricating device layers therefrom, in accordance with the embodiments of the present invention.

DETAILED DESCRIPTION OF THE PREFERRED EMBODIMENTS

Figure 1A:
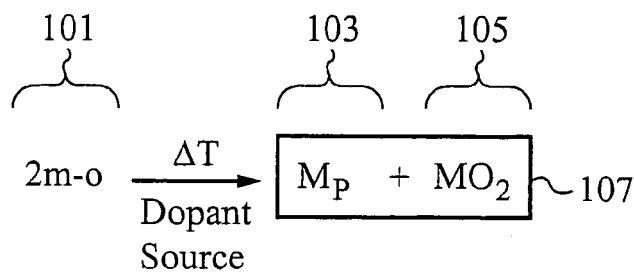
FIGS. 1A-E are equations illustrating making metal nanoparticles, isolating the metal nanoparticles and formulating nanoparticle inks therefrom, in accordance with the embodiments of the present invention.

In accordance with the present invention, nanoparticles are isolated from a composite material 107 and can then be used to form a nanoparticle ink and form device layers therefrom, as described below. Nanoparticles are generally referred to herein as particles having average diameters of 200 nanometers or less, and preferably 100 nanometers or less. Nanoparticles 103, in accordance with the embodiments of the present invention, are formed by treating a metal oxide precursor 101 to conditions, such as elevated temperatures ($\Delta T$), causing the metal oxide precursor 101 to disproportionate and form the metal nanoparticles 103 embedded in an oxide matrix 105 in the composite material 107. Metal oxide precursors 101 is any suitable metal oxide precursor capable of undergoing a disproportionation process, such as cobalt, vanadium, manganese, niobium, iron, nickel, copper, silicon, titanium, germanium, zirconium, tin oxides and combinations thereof Preferably, however, the metal oxide precursor is a metal monoxide and most preferably the metal oxide precursor is silicon monoxide, which forms silicon nanoparticles embedded in a matrix of silicon monoxide and silicon dioxide.

Nanoparticles 103, in accordance with the present invention, are doped or un-doped. To form doped nanoparticles, a dopant source is included during the disproportionation process, as shown in FIG. 1A, wherein an amount of a doping element from the dopant source is incorporated into the nanoparticles 103 formed. The dopant source is preferably a molecular dopant source which includes one or more atoms of the doping element, such as boron, phosphorus and arsenic. Accordingly, a device layer formed using an ink containing the doped metal nanoparticles will preferably be a doped device layer. Dopants, in accordance with further embodiments of the invention, are introduced in an ink formulation along with the metal nanoparticles and/or are introduced into a layer of ink before and/or after curing, to form doped a device layer, as explained in detail below.

Figure 1B:
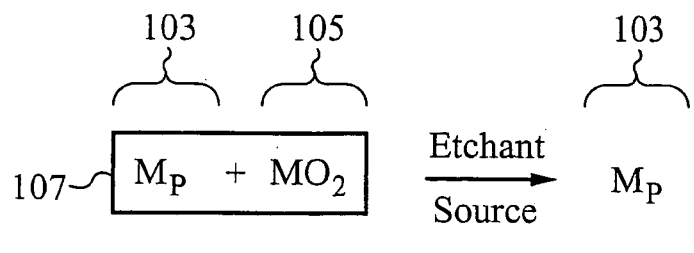

Now referring to FIG. 1B, after the composite material is formed, then the metal nanoparticles 103 are isolated from the composite material 107. The metal nanoparticles 103 are preferably isolated from the composite material 107 using an etchant medium to release the metal nanoparticles 103 from the oxide matrix 105.

Figure 1C:
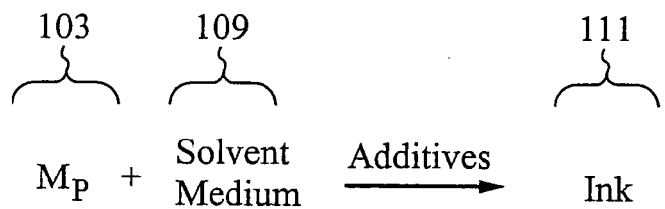

After the metal nanoparticles 103 are isolated from the composite material 107, then the metal nanoparticles 103 are preferably dispersed into a solvent medium 109, such as illustrated in FIG. 1C. The solvent medium 109 preferably includes one or more organic ink solvents. Suitable organic ink solvents include, but are not limited to, saturated, unsaturated, aromatic and halogenated hydrocarbons, ethers, polyethers, esters, amines, amides, alcohols, glycols, thiols, lactones, phosphates, nitriles, silanes, silicones, sulfoxides, fatty acids, germanes, ketones, terpenes, terpineols. More specific examples of suitable organic ink solvents include Mineral Spirits, toluene, xylene, mesitylene, tert-butyltoluene, pyridine, cyclohexylbenzene, tetralin, 3-octanol, 2-ethylhexanol, alpha-terpineol, dyhydroterpineol, cyclohexanone, ethyllactate, cyclomethicones, propylenglycolmonoethylether, diglyme and combinations thereof, to name a few. Futher details of Nanoparticle inks and method for making the same are described in the U.S. patent application Ser. No. 10/215,952, filed Aug. 09, 2002, and entitled "NANOPARTICLE SYNTHESIS AND FORMATION OF INKS THEREFROM", the contents of which are hereby incorporated by reference.

Still referring to FIG. 1C, an ink 111, in accordance with further embodiments of the invention, comprises one or more additives such as surfactants and/or wetting agents. Surfactants include, but are not limited to, amines, amine oxides, ethers, quaternary ammonium salts, betaines, sulfobetaines, polyethers, polyglycols, polyethers, polymers, organic esters, alcohols, phosphines, phosphates, carboxylic acids, carboxylates, thiols, sulfonic acids, sulfonates, sulfates, ketones, silicones and combination thereof. More specific examples of surfactants include, but are not limited to, methyl laureate, methyl oleate, dimethyl succinate, propylenglycol, diglyme, hexadecylamine, ethyl dimethyl amine oxide, tetraoctyl ammonium bromide, poly n-vinyl pyrrolidone, octanol, tributyl phosphine, tributyl phosphate, trioctyl phosphine oxide, hexadecyl thiol, dodecyclbenzene sulfonate, diisobutyl ketone and dodecylhexacyclomethicone.

In yet further embodiments of the invention, an etchant medium (FIG. 1B) comprises a wetting agent such as a fluorinated surfactant and/or a fluorinated hydrocarbon, either alone or in combination with one or more of the aforementioned surfactants. Specific examples of wetting agents include, but are not limited to, perfluorohexanoic acid, perflourodecane, perfluoromethylvinyl ether and hexafluoropropylene oxide. It should also be noted that surfactants and/or wetting agents, such as those described above, can be included in the etchant medium to help solvate or solubilize the nanoparticles in an aqueous or organic solvent medium as the metal nanoparticles 103 are being released from the composite material 107.

Figure 1D:
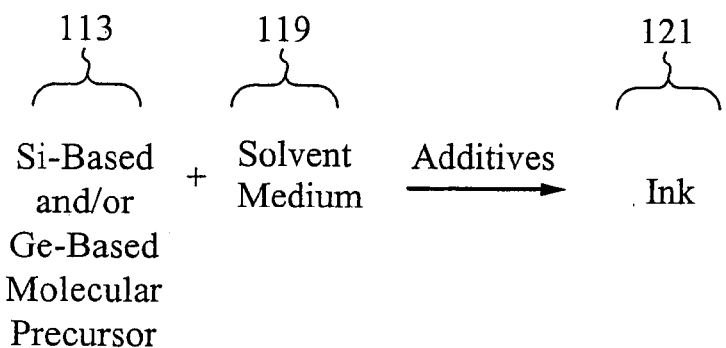

Referring now to FIG. 1D, in accordance with yet further embodiments of the invention, an ink 121 is formulated using one or more of the silicon-based or germanium-based molecular precursors 113, either neat or along with a suitable solvent medium 119. As, mentioned previously the ink 121 can be formulated with any number of different surfactants and/or wetting agents suitable for the application at hand. The molecular precursors 113, in accordance with the embodiments of the invention comprises one or more dopant elements, such as arsenic, phosphorus and/or boron, which can be incorporated into a device layer formed therefrom. A preferred use of the ink 121, is to deposit the ink 121 over a silicon seed layer formed on a suitable substrate structure, such as described in detail below.

Figure 1E:
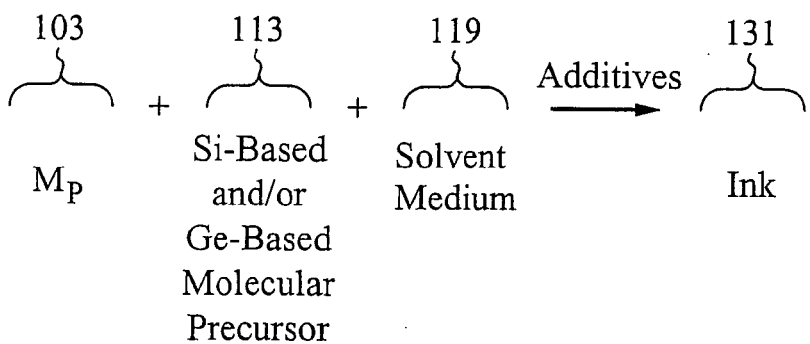

Now referring to FIG. 1E, in accordance with further embodiments of the invention, an ink 131 comprises doped or undoped metal nanoparticles 103 and a doped or undoped molecular precursor 113, such as described above. The ink 131 can also include a solvent medium 119. However, it will be clear to one skilled in the art that where the molecular precursor 113 is a liquid, the molecular precursor 113 can function as a solvent for the metal nanoparticles 103 in the formulation of the ink 131. The ink 131, in still further embodiments of the invention, comprises one or more surfactants, wetting agents and/or one or more dopant sources, such as previously described.

Now generally referring to FIGS. 1C-E, inks 111, 121 and 131, in accordance with the embodiments of the invention, are formulated with any number of different additives, including a crystallization promoter. Crystallization promoters include organometallic compounds and/or metal nanoparticles of Ni, Au, Al and Fe that are dispersed or dissolved in a suitable solvent medium along with a bulk nanoparticle source. Inks 111, 121 and 131, in addition to crystallization promoters, can also include any number of surfactants and/or wetting agents, as explained previously.

Figure 2A:
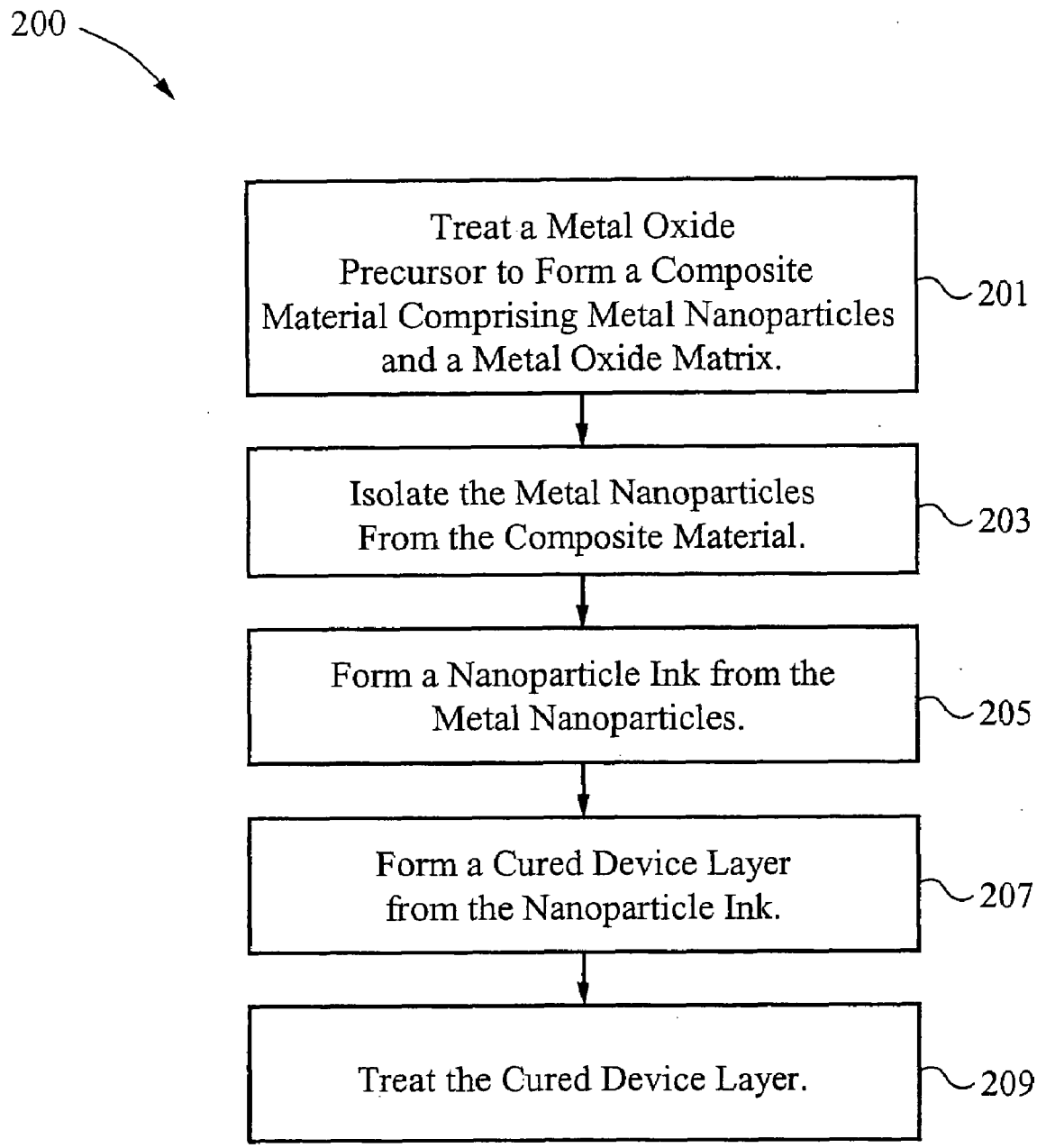

FIG. 2A is a block diagram 200 outlining the step for making metal nanoparticles, formulating inks and forming device layers therefrom, in accordance with the embodiments of the present invention. In the step 201, a metal oxide precursor is treated to form a composite material comprising nanoparticles of the metal and a metal oxide matrix. Generally, forming the composite material comprises heating the metal oxide precursor, however, other methods are contemplated, including ion implantation methods, either alone or in combination with heating. In the case where the metal oxide precursor is silicon monoxide, a composite material is formed by heating the silicon monoxide to temperatures of 600 degrees Celsius or higher for approximately one minute or more, thereby forming silicon nanoparticles embedded in a matrix of silicon oxides (such as silicon monoxide and silicon dioxide).

After the composite material is formed in the step 201, then in the step 203 the metal nanoparticles are isolated from the composite material. Referring to FIG. 2B, the metal nanoparticles are preferably isolated from the composite material by treating the composite material with an etchant medium in the step 211 to release the metal nanoparticles from the composite material, wherein the etchant medium preferentially etches (i.e. at a faster rate) the metal oxide matrix relative to the metal nanoparticles embedded therein. The etchant medium preferably comprises a hydrogen fluoride source, which is an inorganic hydrogen fluoride source (such as $NH_4F$, $HF$, $KHF_2$ and $KF$ or a combination thereof). In further embodiments of the invention, the hydrogen fluoride source is an organo-ammonium fluoride (such as pyridine:HF or any other secondary or tertiary amine:HF material).

Still referring to FIG. 2B, isolating the metal nanoparticles can further include the use of any number of extraction methods and techniques to remove or separate the metal nanoparticles from the etchant medium. For example, when the etchant medium is aqueous, isolating metal nanoparticles can further comprise interfacing the aqueous etchant medium with an organic extraction medium to extract the metal nanoparticles from the aqueous etchant medium after or while the metal nanoparticles are being released from the oxide matrix. In some applications it is advantageous to treat the metal nanoparticles with a surface modifier in the etchant medium to further facilitate the extraction process.

In accordance with still further embodiments of the invention, the etchant medium comprises a bistable phase medium. Bistable phase media, refer to herein as media with two or more constituents, selected from water, organic solvents, fluorinated organic solvents and surfactants which are capable of forming single and multiple phases at different temperatures. Fluorous-phase media, for example, which generally comprise a mixture of a fluorinated solvent and another organic solvent can be used as an etchant medium, wherein the Fluorous-phase media are single phase at a first temperature and separated to a biphase media at a second, generally lower temperature. Accordingly, the composite material comprising the metal nanoparticles can be etched in such a bistable phase medium with the medium in the single phase state and then after the etching process is complete, the bistable phase medium can be cooled to form two or more separated phases, wherein the nanoparticles have a preferred affinity, or solubility, in one or more of the separated phases.

Again referring to FIG. 2A, after the metal nanoparticles are isolated using any number of etching and/or extraction/separation techniques in the step 203, in the step 205 the metal nanoparticles are used to form a nanoparticle ink. As illustrated in FIG. 2C, in order to formulate a metal nanoparticle ink, the metal nanoparticles can be treated with any number of surfactants and/or surface modifiers in the step 215 before dispersing surface modified metal nanoparticles into a suitable solvent medium in the step 217. Alternatively, the solvent medium comprises a surface modifier and/or wetting agent and the metal nanoparticles are dispensed directly into the solvent medium in the step 217. In accordance with the embodiments of the invention, the metal nanoparticles can be treated with a hydride source, such as lithium aluminum hydride, lithium borohydride, or other suitable hydride source, to form hydrogen capped metal nanoparticles. Alternatively, the metal nanoparticles isolated in the step 203 are converted to hydrogen capped metal nanoparticles by the etchant medium used. It should be noted that the nanoparticles of the present invention can also be purified and/or washed any number of times prior to dispersing the metal nanoparticles into the solvent medium. Once the metal nanoparticles are formulated into a nanoparticle ink in the step 205, in the step 207 the ink is deposited onto a suitable substrate structure which can include substrate materials such as, but not limited to, silicon, metal, quartz, glass, polymeric substrate materials and combinations thereof. The nanoparticle ink is deposited using any suitable deposition or coating technique, including but not limited to ink-jet printing, slide-bar coating, screen printing, spin coating, extrusion coating, meniscus coating, dip coating and spray coating. The layer of the nanoparticle ink is deposited in the step 207 is patterned or unpatterned.

Figure 2D:
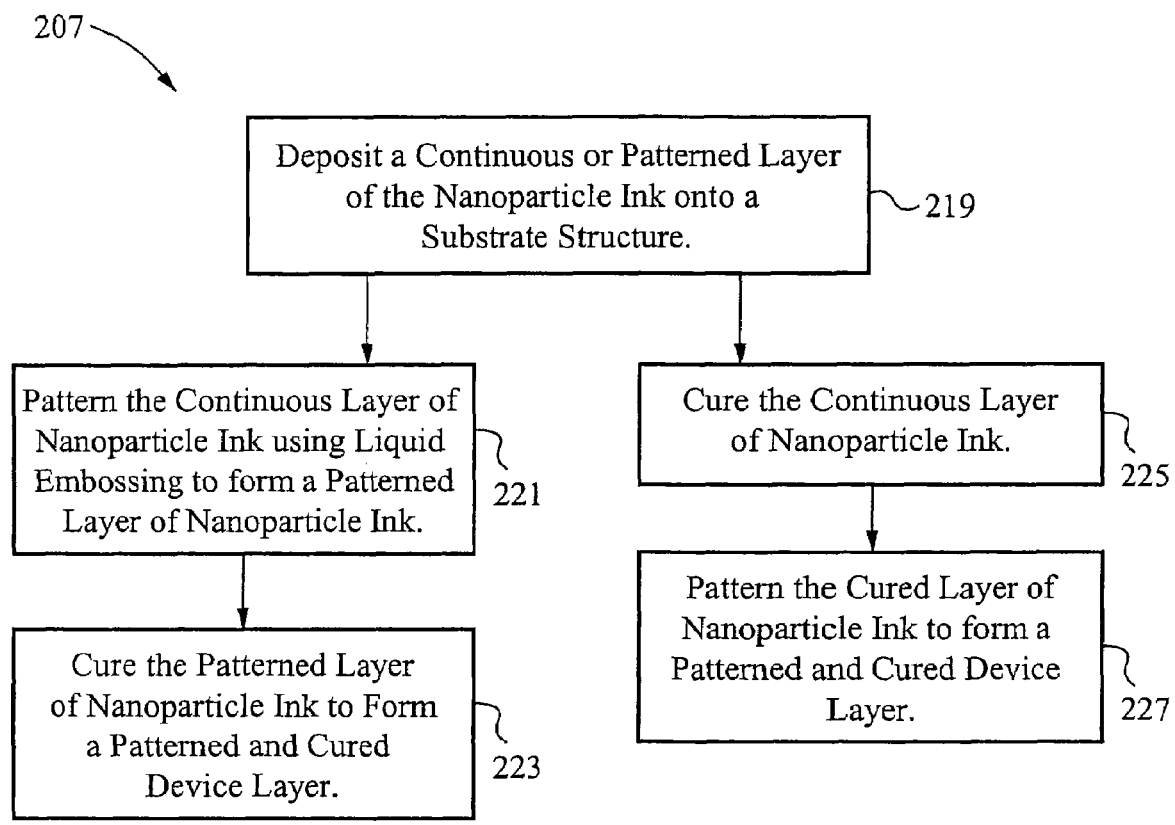

Referring now to FIG. 2D, in accordance with the embodiments of the invention, a layer of nanoparticle ink is deposited as a continuous, or patterned layer, in the step 219. After the layer of ink is deposited as a continuous or patterned layer in the step 219, then in the step 221, the continuous, or patterned, layer is patterned, or futher patterned, using liquid embossing techniques. Methods for forming patterned device layers using liquid embossing techniques are described in U.S. patent application Ser. No. 09/525,734, entitled "FABRICATION OF FINELY FEATURED DEVICE BY LIQUID EMBOSSING" and in U.S. patent application Ser. No. 09/519,722, entitled "METHOD FOR MANUFACTURING ELECTRONIC AND ELEC- TRO MECHANICAL ELEMENTS AND DEVICES BY THIN FILM DEPOSITION AND IMAGING", the contents of which are both hereby incorporated by reference.

Figure 3A:
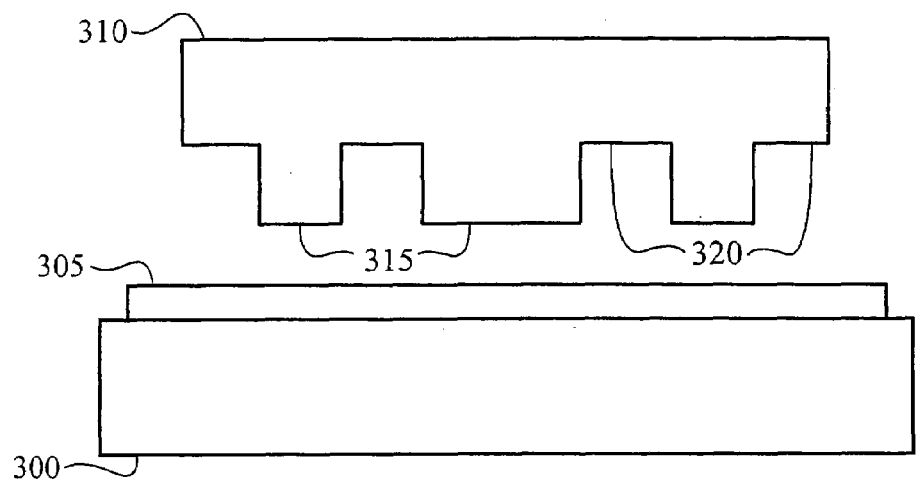
FIGS. 3A-C schematically illustrate forming a patterned device layer on a substrate structure using liquid embossing, in accordance with the embodiments of the present invention.
Figure 3B:
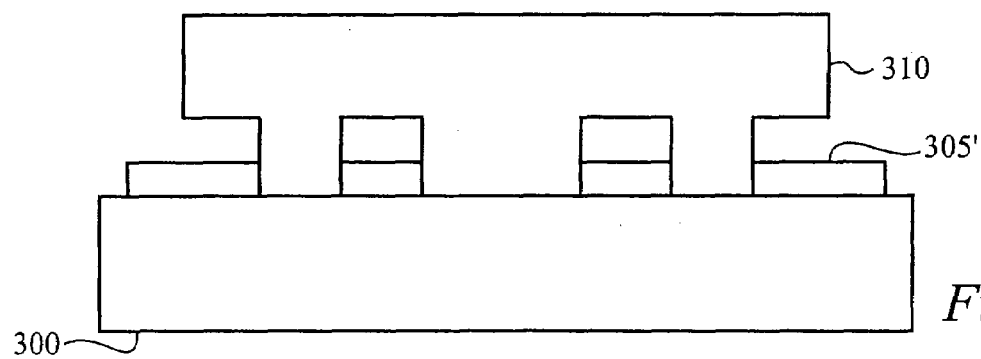
Figure 3C:
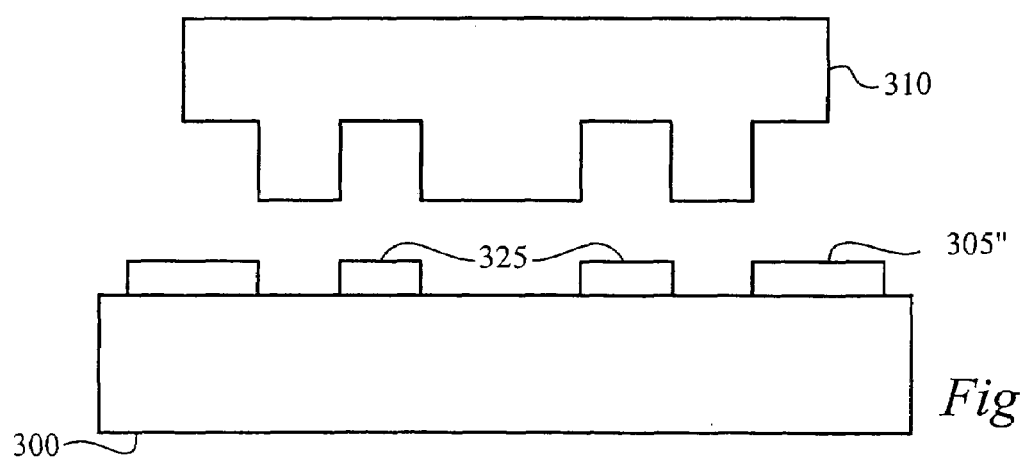

Briefly, FIGS. 3A-C illustrate the embossing technique, in accordance with the embodiments of the invention, for forming one or more patterned device layers from a nanoparticle ink over substrate structure 300. The substrate structure 300 comprises any suitable substrate materials or partial device structures including conductive device layers, a dielectric device layer or combinations thereof (not shown).

Referring to FIG. 3A, in accordance with a preferred method of the invention the substrate structure 300 is coated with a thin film of nanoparticle ink, generally referred to herein as ink 305. The substrate 300 is coated with the thin film of ink 305 using any suitable coating technique such as previously mentioned. An elastomeric stamp 310 having a pattern of projecting or protruding features 315 and recessed features 320 is lowered until the projecting features 315 make contact with substrate structure 300, thereby displacing ink 305 at the regions of contact. The area dimensions of projecting features 315 are constrained by the need for these features to push aside the liquid ink 305 and either make contact with substrate structure 300 or at least displace enough liquid to facilitate its convenient subsequent removal. The maximum areas of features 315 depend greatly on the viscosity of the ink 305, the thickness of the film deposited, and the material(s) used to make the stamp 310.

With the stamp 310 against substrate structure 300 as shown in FIG. 3B, the patterned film 305' may be partially or completely cured. In addition to patterning the liquid ink 305 through displacement of the liquid ink 305 away from the protruding features 315 of the stamp 310 and into the recessed features 320 of the stamp 310, the stamp 310 also simultaneously facilities curing or partial curing of the patterned layer 305' by absorption of solvent from the liquid ink 305. Curing, or partial curing, of the patterned layer 305' by absorption of solvent, helps to form a stable pattern with a high degree of feature definition. It is believed that the stamp material(s), the stamp design(s), the ink material(s) and ink formulation(s) can be judiciously selected to control the rate of solvent absorption. Materials and methods for controlling solvent absorption by a stamp during liquid embossing are further described in the U.S. patent application Ser. No. 10/288,357, filed Nov. 04, 2002, and entitled "CONTROLLED PRINT METHODS", the contents of which are hereby incorporated by reference.

In addition, curing or partial curing in the step 223 (FIG. 2D) of the patterned film 305' can be accomplished with the stamp 310 in contact with the substrate structure 300 and/or with the stamp 310 removed from the substrate structure 300, as shown in FIG. 3C. The preferred method or methods of curing the patterned film 305' is dictated primarily by the nature of the liquid ink 305. Curing method, in accordance with the present invention include, but are not limited to, heating, evaporating a solvent, UV exposure, laser annealing and any combination thereof.

It is found that even if the patterned liquid 305' is not cured while stamp 310 is in contact with substrate 300, it will tend nonetheless to retain the patterned features 325 when stamp 310 is removed form the substrate structure 300 so long as the thickness of the liquid film 305 is sufficiently small. That is, there will be no detectable flow of liquid ink back into areas displaced by the projecting regions of stamp 310, probably due to the absolute height of patterned liquid layer 305' and this is believed to be facilitated by the ability of the stamp to absorb solvent form the ink during the embossing process.

Again referring to FIG. 2D, a device layer, in accordance with an alternative embodiment of the present invention is formed by depositing a continuous layer of nanoparticle ink in the step 219. After depositing the continuous layer of nanoparticle ink in the step 219, then in the step 225 the continuous layer is cured using one or more of the curing methods described previously, to form a solid phase layer. After curing the layer of ink in the step 225 to form the solid phase layer, then in the step 227 the solid phase layer is patterned using any suitable technique for patterning solid phase layers including, but not limited to, lithography, laser ablation and nanoimprint-lithography. By forming multiple layers using the method described above, either alone, or in combination with other device fabrication processes, such as lithographic processes and/or vapor deposition processes, micro devices can be fabricated.

Still referring to FIG. 2D, in the step 219, a patterned or unpatterned layer of ink is deposited onto a substrate structure that comprises a patterned or unpatterned metal layer. The metal layer preferably acts as a crystallization promoter during curing of annealing of a layer of nanoparticle ink. The metal layer, in accordance with the embodiments of the invention, comprises Ni, Au, Al and Fe or a combination thereof, and can be formed using any suitable technique, including, but not limited to, vapor deposition of a molecular precursor, electroless plating and sputtering techniques.

Now referring to FIG. 2A, after a patterned or unpatterned layer of ink is cured to form a cured device layer in the step 207, then in the step 209 the cured device layer can be further treated. In accordance with the embodiments of the present invention, the cured device layer is further treated in the step 211 by doping the layer using ion implantation or depositing a layer of material comprising a dopant over the cured device layer and annealing. Alternatively, or in addition to doping the layer in the step 211, additional patterned, unpatterned, doped and doped layers can be subsequently formed over the cured device layer.

Figure 4A:
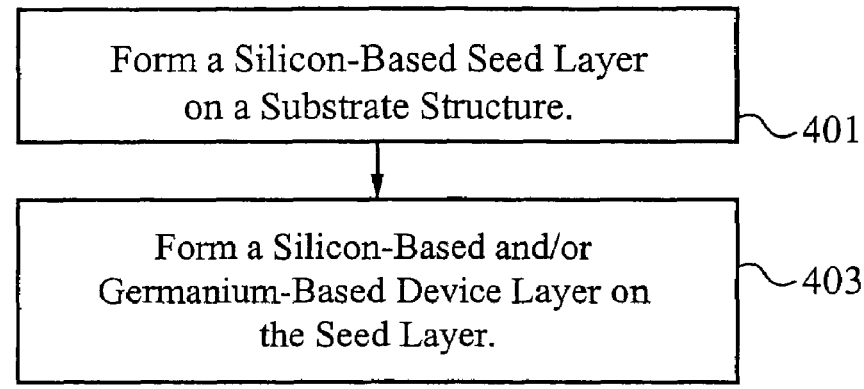
FIGS. 4A-B are flow-charts outlining the steps for making a seed layer on a substrate structure and the formation of a device layer thereon, in accordance with further embodiments of the invention.

Referring now to FIG. 4A, in accordance with an alternative embodiment of the present invention, in the step 401 a silicon seed layer is formed on a suitable substrate structure. After the seed layer is formed on the substrate structure in the step 401, then in the step 403 a silicon or germanium-based device layer is formed over the seed layer. The silicon and/or germanium-based device layer is preferably formed by depositing a patterned or unpatterned layer of ink comprising a silicon-based and/or germanium-based molecular precursor, such as illustrated in FIG. 1D, and curing the layer of ink. Alternatively, a device layer is formed by depositing a silicon-based and/or germanium-based molecular precursor over the seed layer using chemical or physical vapor deposition techniques. In yet further embodiments of the invention, forming a device layer comprises depositing a patterned or unpatterned layer of ink comprising metal nanoparticles over a seed layer using any suitable deposition coating technique, such as described above.

Figure 4B:
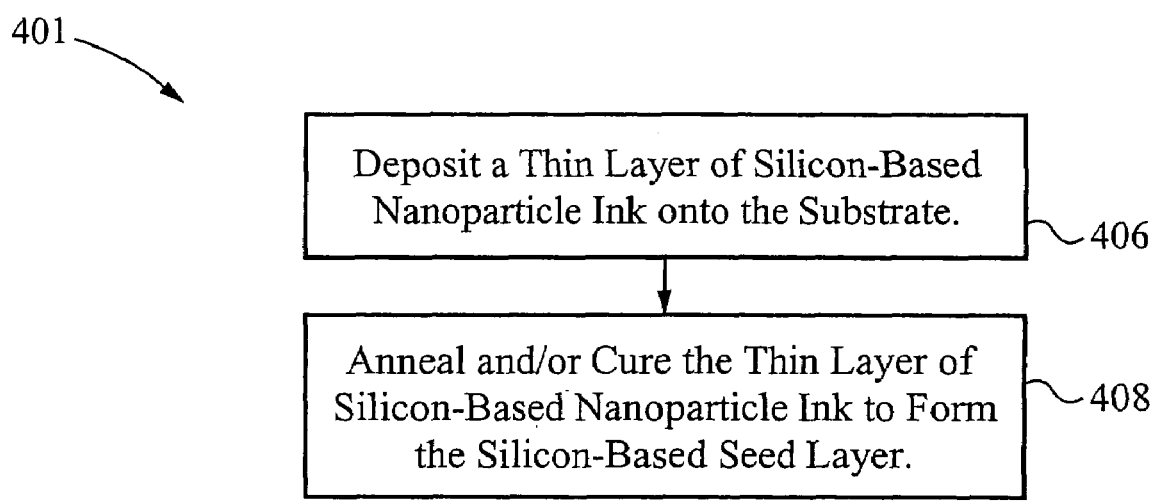

Now referring to FIG. 4B in accordance with a preferred embodiment of the invention, a seed layer is formed in the step 401, using a nanoparticle ink comprising silicon, germanium or silicon and germanium nanoparticles that are formed by disproportionation of a silicon monoxide precursor, a germanium monoxide precursor or a combination thereof, such as described previously. The seed layer can be formed by depositing a thin patterned or unpatterned layer of the nanoparticle ink onto the substrate structure in the step 406 and then in the step 408, curing the thin layer of nanoparticles, using any number suitable curing techniques described previously.

In accordance with the embodiments of the present invention, patterned, unpatterned, doped and undoped device layers are formed using nanoparticle inks to fabricate a number of different micro-devices, such as Thin-Film Transistors. Printing techniques for the fabrication of micro-devices, such as Thin Film Transistors are further described in U.S. patent application Ser. No. 10/251,077, filed Sep. 20, 2002, and entitled "FABRICATION OF MICRO-ELECTRONIC DEVICES", the contents of which are hereby incorporated by reference.

The present invention has been described in terms of specific embodiments incorporating details to facilitate the understanding of the principles of construction and operation of the invention. As such, references, herein, to specific embodiments and details thereof are not intended to limit the scope of the claims appended hereto. It will be apparent to those skilled in the art that modifications can be made in the embodiment chosen for illustration without departing from the spirit and scope of the invention.

What is claimed is:

1. A method of making a nanoparticle ink comprising:
   a. isolating nanoparticles from a composite material comprising a metal oxide of the metal and nanoparticles; wherein the nanoparticles comprises (a) treating one or more metal monoxide precursors to form the composite material and (b) treating the composite material with an etchant comprising a hydrogen fluoride source to release the Nan particles from the composite material and
   b. dispersing the nanoparticles into a solvent medium.

2. The method of claim 1, wherein the solvent medium comprises a molecular precursor.

3. The method of claim 2, wherein the molecular precursor comprises a material selected from the group consisting of a polysilane, silylenes and organo-silanes.

4. The method of claim 3, wherein the molecular precursor comprises a hetero-atom selected from the group consisting of arsenic, phosphorus and boron.

5. The method of claim 2, wherein the molecular precursor comprises a material selected from the group consisting of a polygermane, germylenes and organo-germanes.

6. The method of claim 5, wherein the molecular precursor comprises a hetero atom selected from the group consisting of arsenic, phosphorus and boron.

7. The method of claim 3, wherein molecular precursor comprises a cyclic polysilane.

8. The method of claim 1, wherein the one or more metal monoxide precursors comprise silicon.

9. The method of claim 1, wherein the one or more metal monoxide precursors comprise germanium.

10. The method of claim 1, wherein the etchant comprises a surfactant.

11. The method of claim 1, wherein the hydrogen fluoride source comprises a fluoride material selected from the group consisting of $NH_4F$, $HF$, $KHF_2$ and $KF$.

12. The method of claim 1, wherein the etchant further comprises an ammonium salt.

13. The method of claim 1, wherein the etchant further comprises a wetting agent.

14. The method of claim 13, wherein the wetting agent is a fluorinated wetting agent.

15. The method of claim 1, wherein treating the one or more metal monoxide precursors is performed in the presence of a dopant and wherein the dopant is incorporated into the nanoparticles.

16. The method of claim 1, wherein one or more metal monoxide precursors comprises a metal selected from the group consisting of cobalt, vanadium, manganese, niobium, iron, nickel, copper, silicon, titanium, germanium, zirconium and tin.

17. The method of claim 1, wherein the solvent medium comprises an organic solvent.

18. The method of claim 1, wherein the solvent medium comprises a surfactant.

19. The method of claim 18, wherein the surfactant is selected from the group consisting of an amine, an amine oxide, a quatenary ammonium salt, a betaine, a sulfobentaine, a ether, a polyglycol, a polyether, a polymer, an organic ester, an alcohol, a phosphine, a phosphate, a carboxylic acid, a carboxylate, a thiol, a sulfonic acid, a sulfonate, a sulfate, a ketone and a silicone.

20. The method of claim 1, wherein the solvent medium comprises a molecular precursor.

21. The method of claim 1, wherein the solvent medium further comprises a crystallization promoter.

22. The method of claim 21, wherein the crystallization promoter is an organometallic compound comprising a element selected from the group consisting of Ni, Au, Al and Fe.

23. The method of claim 21, wherein the crystallization promoter comprises nanoparticles comprising an element selected from the group consisting of Ni, Au, Al and Fe.

* * * * *

UNITED STATES PATENT AND TRADEMARK OFFICE
CERTIFICATE OF CORRECTION

| | | |
|---|---|---|
| PATENT NO. | : 7,259,100 B2 | Page 1 of 1 |
| APPLICATION NO. | : 11/271041 | |
| DATED | : August 21, 2007 | |
| INVENTOR(S) | : Fabio Zurcher et al. | |

It is certified that error appears in the above-identified patent and that said Letters Patent is hereby corrected as shown below:

IN THE SPECIFICATION

At column 4, line 25, please replace "layer, including" to -- layer. --

Signed and Sealed this

Sixth Day of November, 2007

JON W. DUDAS
*Director of the United States Patent and Trademark Office*

UNITED STATES PATENT AND TRADEMARK OFFICE
CERTIFICATE OF CORRECTION

PATENT NO. : 7,259,100 B2
APPLICATION NO. : 11/271041
DATED : August 21, 2007
INVENTOR(S) : Zurcher et al.

It is certified that error appears in the above-identified patent and that said Letters Patent is hereby corrected as shown below:

IN THE SPECIFICATION

Column 1, lines 51-52 of the issued patent: change "and decomposed the mixture of the metal powder and the organo-metallic compound to form the conductive layer" to --and the mixture of the metal powder and the organo-metallic compound decomposed to form the conductive layer--.

Column 2, line 34 of the issued patent: change "sulfobentaine" to --sulfobetaine--.

Column 4, line 63 of the issued patent: change "unpattemed" to --unpatterned--.

Column 4, line 64 of the issued patent: change "meal" to --metal--.

Column 4, line 65 of the issued patent: change "pattern" to --patterned--.

Column 4, line 65 of the issued patent: change "unpattemed" to --unpatterned--.

Column 9, line 6 of the issued patent: change "form" to --from--.

Column 10, line 2 of the issued patent: change "form" to --from--.

Column 10, line 22 of the issued patent: change "unpattemed" to --unpatterned--.

Column 10, line 24 of the issued patent: change "of annealing" to --or annealing--.

Column 10, line 39 of the issued patent: change "doped and doped" to --doped and undoped--.

Column 10, line 48 of the issued patent: change "unpattemed" to --unpatterned--.

IN THE CLAIMS

Claim 1, column 10, line 27 of the issued patent: change "wherein the" to --wherein making the--.

UNITED STATES PATENT AND TRADEMARK OFFICE
CERTIFICATE OF CORRECTION

PATENT NO.      : 7,259,100 B2
APPLICATION NO. : 11/271041
DATED           : August 21, 2007
INVENTOR(S)     : Zurcher et al.

It is certified that error appears in the above-identified patent and that said Letters Patent is hereby corrected as shown below:

Claim 1, column 10, line 31 of the issued patent: change "Nan particles" to --nanoparticles--.

Cancel Claim 20 (column 12, lines 37 - 38).

Signed and Sealed this

Twenty-third Day of December, 2008

JON W. DUDAS
*Director of the United States Patent and Trademark Office*